US012635098B2

(12) United States Patent
Dienwiebel et al.

(10) Patent No.: US 12,635,098 B2
(45) Date of Patent: May 19, 2026

(54) CONNECTOR FOR CONNECTING A LINE TO A PRINTED CIRCUIT BOARD, HOUSING HAVING SUCH A CONNECTOR, AND ASSEMBLY COMPRISING A PRINTED CIRCUIT BOARD AND SUCH A HOUSING

(71) Applicant: HELLA GmbH & Co. KGaA, Lippstadt (DE)

(72) Inventors: Sascha Dienwiebel, Lippstadt (DE); Steffen Hoppe, Lippstadt (DE); Andreas Kupezki, Lippstadt (DE); Stefan Peters, Lippstadt (DE); Eckart Wirries, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 285 days.

(21) Appl. No.: 18/380,082

(22) Filed: Oct. 13, 2023

(65) Prior Publication Data

US 2024/0049416 A1 Feb. 8, 2024

Related U.S. Application Data

(63) Continuation of application No. PCT/EP2022/058432, filed on Mar. 30, 2022.

(30) Foreign Application Priority Data

Apr. 13, 2021 (DE) ..................... 10 2021 109 221.3

(51) Int. Cl.
*H05K 5/06* (2006.01)
*H05K 5/00* (2025.01)

(52) U.S. Cl.
CPC ........... *H05K 5/069* (2013.01); *H05K 5/0069* (2013.01)

(58) Field of Classification Search
CPC ...... H05K 5/069; H05K 5/0069; H02G 3/088; H01R 13/40; H01R 13/405; H01R 13/5216
See application file for complete search history.

(56) References Cited

U.S. PATENT DOCUMENTS 10,073,163 B2 * 9/2018 Philipp ................ H05K 5/0052
2020/0084898 A1 * 3/2020 Hoefer ................. H05K 1/0278

FOREIGN PATENT DOCUMENTS

DE 102013201424 A1 7/2014
DE 202015104646 U1 10/2015

OTHER PUBLICATIONS

International Search Report dated Jul. 15, 2022 in corresponding application PCT/EP2022/058432.

* cited by examiner

Primary Examiner — Edwin A. Leon
(74) Attorney, Agent, or Firm — Muncy, Geissler, Olds & Lowe, P.C.

(57) ABSTRACT

A connector connecting a line to a printed circuit board. The connector has a section of the line that has a first end, has a connection element that is joined to the end of the section of the line by a first end and is joined to a printed circuit board by a second end, has an insert part that receives the first end of the connection element and the end of the section of the line, the insert part has a recess through which the connection element projects or in which the first end of the connection element and the end of the section of the line are arranged, and has a cured casting compound that fills the recess so as to enclose the connection element or so as to enclose the first end of the connection element and the end joined thereto of the section of the line.

9 Claims, 3 Drawing Sheets

CONNECTOR FOR CONNECTING A LINE TO A PRINTED CIRCUIT BOARD, HOUSING HAVING SUCH A CONNECTOR, AND ASSEMBLY COMPRISING A PRINTED CIRCUIT BOARD AND SUCH A HOUSING

This nonprovisional application is a continuation of International Application No. PCT/EP2022/058432, which was filed on Mar. 30, 2022, and which claims priority to German Patent Application No. 10 2021 109 221.3, which was filed in Germany on Apr. 13, 2021, and which are both herein incorporated by reference.

BACKGROUND OF THE INVENTION

Field of the Invention

The invention relates to a connector for connecting a line to a printed circuit board, a housing, in particular having such a connector for connection, and an assembly having a printed circuit board and such a housing.

Description of the Background Art

An electronic circuit arrangement can be protected from the environment using housings, for example housings of sensors in motor vehicles. Effective sealing of the housing is a necessary condition for protection. Without sealing, media from the environment can penetrate to the circuit arrangement and make it unusable, in particular damage or destroy it. For example, the sealing of the housing of a sensor that is subjected to challenging environmental conditions (specifically, aggressive media, oil, moisture, dirt, dust) on account of its use and its installation location requires particular care. Such a sensor can have a two-piece housing (housing bottom part and housing top part or first housing part and second housing part), a printed circuit board that is arranged in the housing and has electronic components arranged thereon, and a connecting cable that is connected to the housing. The goal is to seal the housing as hermetically as possible so that the components, in particular, are protected from entry of aggressive media.

One frequently employed option for protecting the circuit arrangement from harmful environmental influences consists in completely covering the components on the printed circuit board with potting compound, typically a plastic resin (for example, epoxy resin). This is labor-intensive and expensive, however.

In the document DE 20 2015 104 646 U1, a lighting device is disclosed having a housing, a printed circuit board arranged therein, and a cable that is passed through an opening in a bottom part of the housing and through an opening in the printed circuit board. Located on the printed circuit board are contact elements that are each connected to one of the wires of the cable. Arranged on the printed circuit board and around the contact elements and the printed circuit board opening is a protector that encloses a receiving space. This receiving space is potted with a casting compound, which then surrounds the entry region of the cable in the housing as well as the contact elements on the printed circuit board. In this design, the cured casting compound also serves, in particular, as strain relief for the cable, which is passed into the housing with slack.

The document DE 20 2015 104 646 U1 teaches to protect the joint between the cable and the contact elements, and to form said joint as strain relief. The document does not teach how the interior of the housing can be protected from the entry of a medium from the environment, however. The document DE 20 2015 104 646 U1 therefore does not disclose an alternative to the complete potting of the circuit arrangement.

SUMMARY OF THE INVENTION

It is therefore an object of the invention is based on the problem of protecting a circuit arrangement that is arranged in a housing. The desire is, in particular, to ensure that a medium cannot enter the housing at a location where a line is led into the housing.

This problem can be solved by an idea that can be implemented in two ways.

Firstly, the idea can be implemented by connector for connecting a line to a printed circuit board, wherein the connector has a section of the line, which section has a first end, has a connection element that is joined to the end of the section of the line by a first end and that can be joined to a printed circuit board by a second end, has an insert part that receives the first end of the connection element and the end of the section of the line, wherein the insert part has a recess through which the connection element projects or in which the first end of the connection element and the end of the section of the line are arranged, and has a cured casting compound that a) fills the recess so as to enclose the connection element, or b) fills the recess so as to enclose the first end of the connection element and the end joined thereto of the section of the line.

This connector can then be inserted into a housing for an electrical or electronic assembly, wherein the housing has a first housing part with an opening into which the insert part is inserted in order to close this opening, wherein the second end of the connection element projects into the housing and the section of the line projects out of the housing. The insert part can also be a housing part.

The idea can also be implemented by a housing for an electrical or electronic assembly, wherein the housing has a first housing part, wherein the housing has a section of the line, which section has a first end, has a connection element that is joined to the end of the section of the line by a first end and that can be joined to a printed circuit board by a second end, has a recess through which the connection element projects or in which the first end of the connection element and the end of the section of the line are arranged, and has a cured casting compound that a) fills the recess so as to enclose the connection element, or b) fills the recess so as to enclose the first end of the connection element and the end joined thereto of the section of the line.

Both implementations according to the invention of the idea on which the invention is based make it possible to create an assembly with a housing in which the location where a line is led into the housing is sealed in a particular manner in the recess of the insert part that can be inserted into a housing or in the recess of the first housing part. A plastic used for the manufacture preferably enters into a permanent joint with the line, for example an insulation of the line, and can simultaneously form a strain relief as a result. In a variant of the two implementations, the joint between the line and the connection element or the electrical joint between conductor and the connection element can be enclosed by the overmolding.

The invention makes it possible that the casting compound need be applied only in specific areas, namely in the areas where overmolded connection elements, regardless of form, project into the interior of the housing. By avoiding direct contact of the cured casting compound with aggressive media, in particular oil in conjunction with atmospheric oxygen, a more economical and easier to handle casting compound can be chosen owing to reduced requirements. After manufacture of the complete, hermetically sealed housing, the cured casting compound is only accessible from the interior of the housing. As a result, a simpler and more economical process is also possible: thus, it is possible to dispense with any necessary plasma pretreatment and a vacuum casting, and the curing of the casting compound can take place at low temperatures in continuous ovens.

According to the invention, a casting compound can be used that is applied in the recess in liquid form and subsequently cured in such a manner that the casting compound is dimensionally stable, at least without the influence of pressure. The cured casting compound can certainly still be soft, however, which is to say plastically and/or elastically deformable under the influence of pressure.

A silicone rubber-based material, for example, can be used as casting compound. Such casting compounds are substantially easier to apply and cure and, moreover, are also more economical. However, they are chemically not as stable as, for instance, epoxy resin with regard to aggressive media, e.g., oil, especially in conjunction with atmospheric oxygen. Since the housing itself is hermetically sealed, for example by welding the housing parts together, the cured casting compound in the interior of the housing does not come into contact with aggressive media. The single "weak point" is the region where the line is passed into the housing or insert part. It may happen here that, for example, very small quantities of oil "creep" as far as the location where the connection element projects through the recess. However, this location is sealed with the casting compound such that the contact region between casting compound and oil is so minimal that even if the casting compound there is partially attacked by the aggressive medium, it is not damaged to the extent that the aggressive medium can reach the interior of the housing.

The casting compound can be a silicone gel, for example. It can be a silicone gel that has been mixed together from two components. The silicone gel can be a polydimethylsiloxane with functional groups and additives for addition crosslinkage. The first component can contain a platinum catalyst and the second component can contain a crosslinking agent.

The connector according to the invention or the housing according to the invention can have a compression connector or a solder joint, and the end of the line, in particular a conductor of the line, and the connection element are joined to one another by the compression connector or the solder joint. The compression connector or the solder joint can be encased by the plastic of the first housing part or of the insert part.

The line can have insulation that projects into the recess of the insert part, wherein the part projecting into the recess of the insert part or of the first housing part is encased by the plastic of the first housing part or of the insert part.

An electrical or electronic assembly according to the invention can have a housing; a printed circuit board that has conductive traces; electrical or electronic components that are arranged on the printed circuit board and that, together with the conductive traces, form an electrical or electronic circuit arrangement; and at least one connection element. The housing of an electrical or electronic assembly according to the invention is designed as described above in accordance with the invention.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
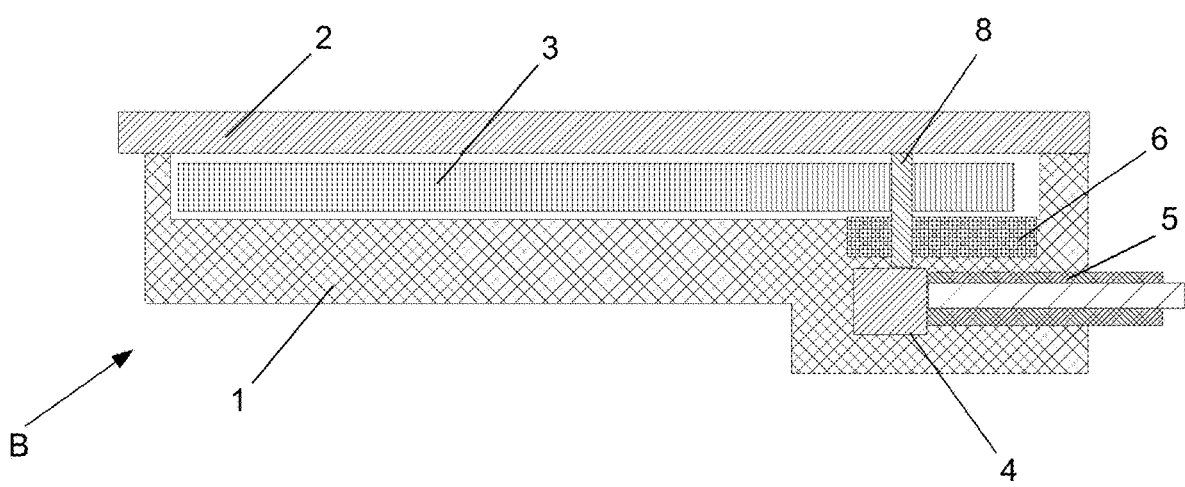
FIG. 1 shows an example of an assembly according to the invention.

The depicted variants of an assembly B according to the invention have a housing 1, 2 with a first housing part 1 and a second housing part 2. The two housing parts 1, 2 are joined together and hermetically sealed by a weld. Arranged in the housing 1, 2 and encased by the housing parts 1, 2 is a printed circuit board 3 that carries electronic components and has conductive traces, which together form an electronic circuit arrangement. The circuit arrangement is joined to a line 5 by a connection element 8. For this purpose, the connection element 8 is joined mechanically (for example, by means of a press-fit contact) to the printed circuit board and electrically to the circuit arrangement in a known manner. The line 5 has insulation, and has an electrically conductive conductor in the insulation.

Figure 2:
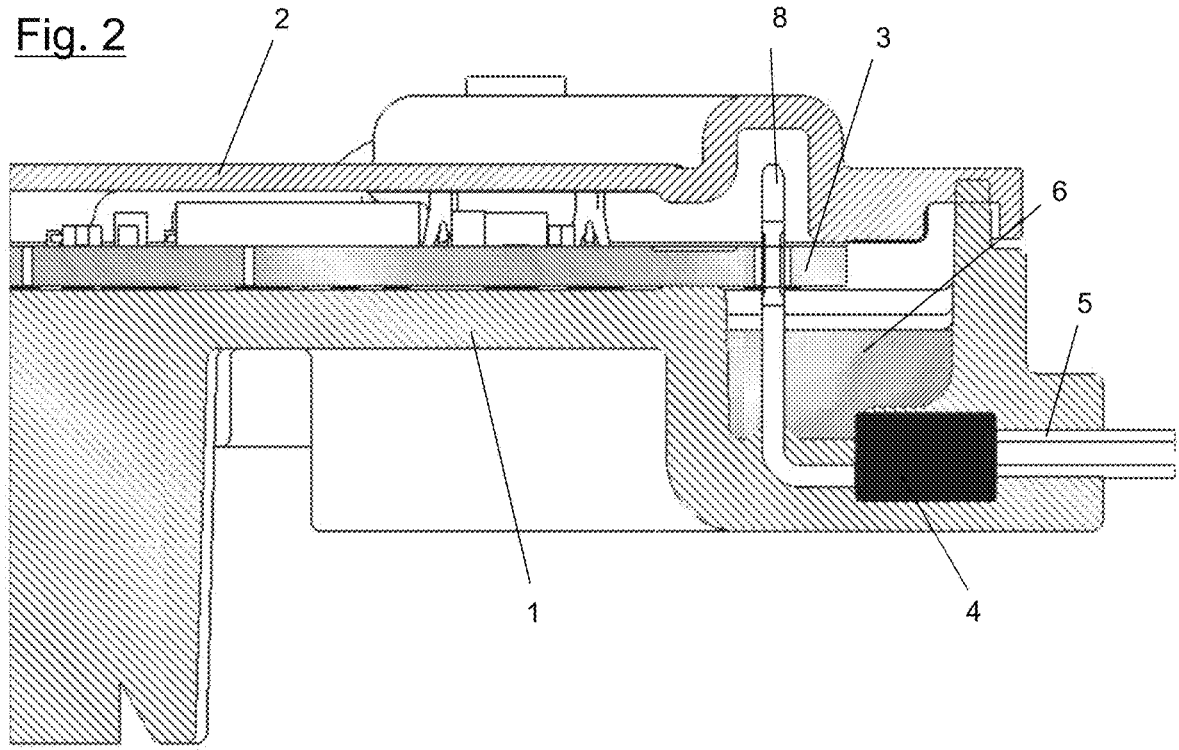
FIG. 2 shows an example of an assembly according to the invention.

In the variants shown in FIGS. 1 and 2, a recess that is filled with a cured casting compound 6 is provided in the first housing part 1.

In the variants shown in FIG. 1 and FIG. 2, the conductor of the line 5 and the connection element 8 are joined to one another in a wall of the first housing part 1 so as to be electrically conductive. The joint 4 between the conductor and the connection element 8, and a piece of the insulation, are encased by a wall of the first housing part 1. For this purpose, the joint 4 and, if appropriate, part of the connection element 8 as well, have been overmolded during the manufacture of the first housing part 1 with the plastic used for the manufacture of the first housing part.

The connection element 8 projects through the recess in the first housing part 1, which recess is filled with the casting compound 6 and opens to the interior of the housing 1, 2. The casting compound 6 fills the recess and in doing so seals the connection region or lead-in region of the assembly B so that no medium can enter the housing 1, 2 from outside.

Figure 3:
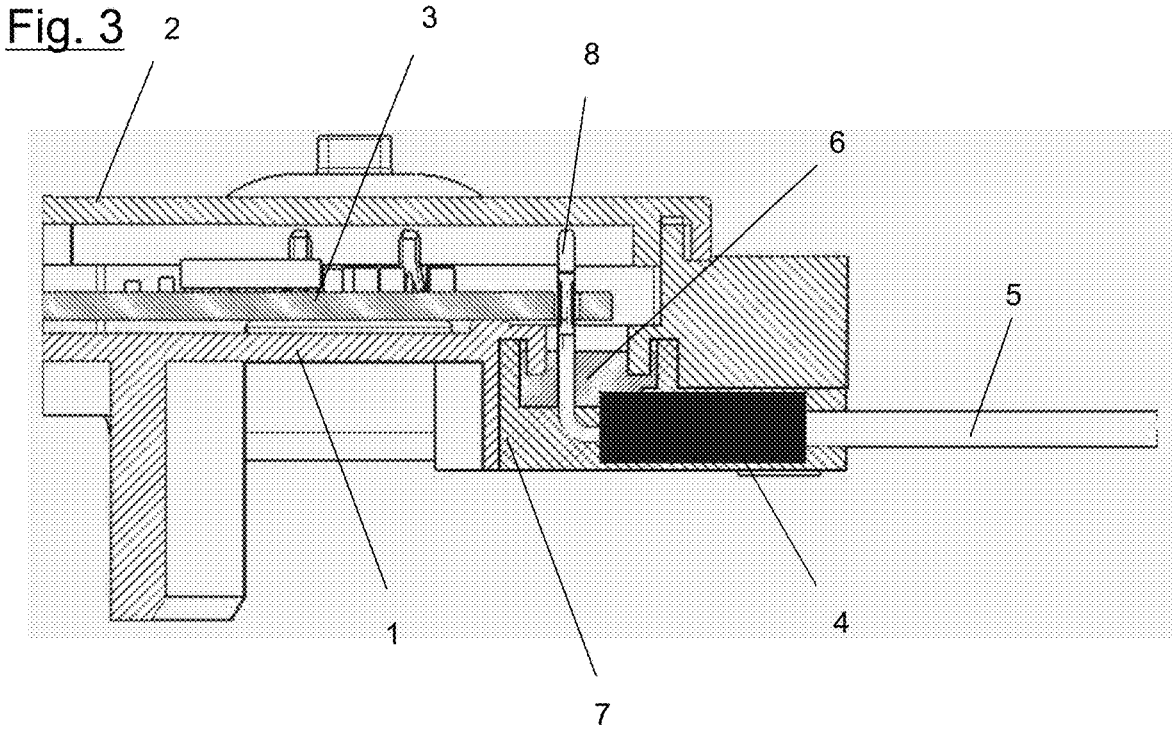
FIG. 3 shows an example of an assembly according to the invention with an insert part according to the invention.

In the variant shown in FIG. 3, the first housing part 1 has an opening into which an insert part 7 is inserted. This insert part is permanently joined to the housing part 1. The joint between the connection element 8 and the conductor of the line 5 is produced in the insert part. This joint can also be produced by a compression connector. The joint between the connection element 8 and the conductor is encased in the insert part 7, which can be brought about by overmolding the joint when the insert part 7 is manufactured of plastic.

In the variant shown in FIG. 3, a recess is provided in the insert part 7, which recess is filled with a cured casting compound 6. Structures of the first housing part 1 and/or of a second housing part engage in this recess, via which the joint between the first housing part 1 and/or the second housing part and the insert part 7 is sealed.

The use of an insert part 7 makes it possible to match an assembly according to the invention to different locations of use with no need to design and manufacture a housing 1, 2 suitable for every location of use. The assembly type can be adapted to different locations of use by the choice of an individual insert part 7 that is matched to the assembly's location of use. To do so, all that is then needed is to choose the suitable insert part 7.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A connector to connect a line to a printed circuit board, the connector comprising:
    a section of the line, the section of the line having a first end;
    a connection element, a first end of the connection element being joined to the first end of the section of the line and a second end of the connection element being adapted to be joined to a printed circuit board;
    an insert part, the first end of the connection element and the first end of the section of the line being received inside of the insert part, and the insert part having a recess through which the connection element projects or in which the first end of the connection element and the first end of the section of the line are arranged; and
    a cured casting compound that fills the recess so as to enclose the connection element or fills the recess so as to enclose the first end of the connection element and the first end of the section of the line joined thereto.

2. The connector according to claim 1, further comprising a compression connector or a solder joint provided inside of the insert part, wherein the first end of the section of the line and the connection element are joined to one another by the compression connector or the solder joint.

3. The connector according to claim 2, wherein the compression connector or the solder joint is encased by a plastic from which the insert part is made.

4. The connector according to claim 1, wherein the line has insulation that projects into the insert part, and wherein the insulation that projects into the insert part is encased by a plastic from which the insert part is made.

5. A housing for an electrical or electronic assembly comprising:
    the connector according to claim 1; and
    a first housing part having an opening into which the insert part is inserted in order to close the opening,
    wherein the second end of the connection element projects into the housing and the section of the line projects out of the housing.

6. A housing for an electrical or electronic assembly, the housing comprising:
    a first housing part, the first housing part comprising:
        a section of a line that has a first end;
        a connection element, a first end of the connection element being joined to the first end of the section of the line and a second end of the connection element adapted to be joined to a printed circuit board;
        a recess through which the connection element projects or in which the first end of the connection element and the first end of the section of the line are arranged; and
        a cured casting compound that fills the recess so as to enclose the connection element or fills the recess so as to enclose the first end of the connection element and the first end of the section of the line joined thereto
    wherein the first end of the section of the line and the connection element are joined to one another by a compression connector or a solder joint.

7. The housing according to claim 6, wherein the compression connector or the solder joint is encased by a plastic from which the first housing part is made.

8. The housing according to claim 6, wherein the line has insulation that projects into a wall of the first housing part, wherein the insulation that projects into the wall of the first housing part is encased by a plastic from which the first housing part is made.

9. An electrical or electronic assembly comprising:
    a housing,
    a printed circuit board that has conductive traces,
    electrical or electronic components that are arranged on the printed circuit board and that, together with the conductive traces, form an electrical or electronic circuit arrangement,
    a section of a line, the section of the line having a first end,
    a connection element, a first end of the connection element being joined to the first end of the section of the line and a second end of the connection element being adapted to be joined to the printed circuit board,
    an insert part, the first end of the connection element and the first end of the section of the line being received inside of the insert part, and the insert part having a recess through which the connection element projects or in which the first end of the connection element and the first end of the section of the line are arranged, and
    a cured casting compound that fills the recess so as to enclose the connection element or fills the recess so as to enclose the first end of the connection element and the first end of the section of the line joined thereto
    wherein the housing has a first housing part having an opening into which the insert part is inserted in order to close the opening, and
    wherein the second end of the connection element projects into the housing and the section of the line projects out of the housing.

* * * * *